US 6,744,391 B2

(12) United States Patent
Mooney et al.

(10) Patent No.: US 6,744,391 B2
(45) Date of Patent: Jun. 1, 2004

(54) SYSTEM FOR SAMPLING A SIGNAL IN AN ELECTRONIC INSTRUMENT USING A UNIPOLAR A/D CONVERTER

(75) Inventors: Travis L. Mooney, Garfield, WA (US); Tony J. Lee, Pullman, WA (US); Bruce A. Hall, Pullman, WA (US)

(73) Assignee: Schweitzer Engineering Laboratories, Pullman, WA (US)

( * ) Notice: Subject to any disclaimer, the term of this patent is extended or adjusted under 35 U.S.C. 154(b) by 0 days.

(21) Appl. No.: 10/147,641

(22) Filed: May 16, 2002

(65) Prior Publication Data

US 2003/0214424 A1 Nov. 20, 2003

(51) Int. Cl.[7] .................................................. H03M 1/00
(52) U.S. Cl. ........................ 341/126; 341/127; 341/155; 361/179
(58) Field of Search .................................. 341/126, 127, 341/155, 132, 156, 158, 163; 361/87, 79, 63

(56) References Cited

U.S. PATENT DOCUMENTS

| 3,982,240 A | * | 9/1976 | Waehner ........................ 341/127 |
| 5,194,865 A | * | 3/1993 | Mason et al. ................... 341/132 |
| 6,370,483 B1 | * | 4/2002 | Beckwith ........................ 361/79 |

* cited by examiner

*Primary Examiner*—Michael Toker
*Assistant Examiner*—Lam T. Mai
(74) *Attorney, Agent, or Firm*—Cook, Alex, McFarron, Manzo, Cummings & Mehler, Ltd.

(57) ABSTRACT

The system includes a unipolar A/D converter, which samples analog signal inputs thereto, the A/D converter being used in a protective relay for electric power systems. The unipolar A/D converter is responsive to input voltage values and current values from the power line to produce corresponding digital signals. The A/D converter has a ground pin voltage reference at least as negative as the most negative point of the input signal to be processed.

6 Claims, 2 Drawing Sheets

SYSTEM FOR SAMPLING A SIGNAL IN AN ELECTRONIC INSTRUMENT USING A UNIPOLAR A/D CONVERTER

TECHNICAL FIELD

This invention relates generally to the sampling of analog signals in an electronic instrument, such as protective relays for power systems, and more specifically concerns a sampling system, which includes a unipolar A/D converter.

BACKGROUND OF THE INVENTION

In conventional microprocessor-based protective relays used for protection of electric power systems, the three separate phase voltages ($V_1$, $V_2$ and $V_3$) and the three separate phase currents ($I_1$, $I_2$ and $I_3$) from the power line being protected are applied through a step-down transformer or other step-down conversion system to reduce the magnitude of the voltage and current values. The stepped-down values are then low-pass filtered and multiplexed prior to the application of those values to an analog-to-digital converter. The analog-to-digital converter converts the analog input signals to digital signals, which are then applied to a conventional processor (microcontroller) which performs selected conventional protection functions using the input signals and provides trip signals for a circuit breaker when the results of the processing indicate a fault on the power line.

Such systems and other electronic instruments use a bipolar analog-to-digital converter, which measures both positive and negative voltages with respect to ground. A bipolar A/D converter is required when it is anticipated that the inputs will be both positive and negative with respect to ground.

However, conventional bipolar A/D converters are relatively expensive. Use of a unipolar A/D converter can reduce the cost of protective relays, which is desirable, since they are less expensive than bipolar A/D converters. While unipolar A/D converters are less expensive than bipolar A/D converters, the signals applied to the input of the converter are required to be completely positive, i.e. the entire signal must be above ground. This has meant modifying the incoming signal in some fashion to make the incoming signals always positive, such as offsetting the ground reference of the step-down stage, or injecting an offset between the step-down stage and the low-pass filter or within the low-pass filter, so that the output from the low-pass filter stage will always be positive with respect to ground.

However, these attempts each have their own respective disadvantages, in some cases involving the gain accuracy of the circuit and in other cases introducing a phase shift and a difference in A/D response, which will differ in accordance with the frequency of the signal. Accordingly, unipolar A/D converters have generally not been used in protective relay applications or other similar instruments.

SUMMARY OF THE INVENTION

Accordingly, the present invention is a system for sampling a bipolar analog signal, the sampling system being used in a protective relay for an electric power system, comprising: a unipolar A/D converter for processing bipolar input analog signals in the form of voltage and current values to corresponding digital output signals, wherein the A/D converter has a ground pin reference voltage which is at least as negative as the most negative portion of the input signals to be processed by the A/D converter, such that the entire range of input signals is processed by the A/D converter to produce a corresponding digital output signal.

BEST MODE FOR CARRYING OUT THE INVENTION

Figure 1:
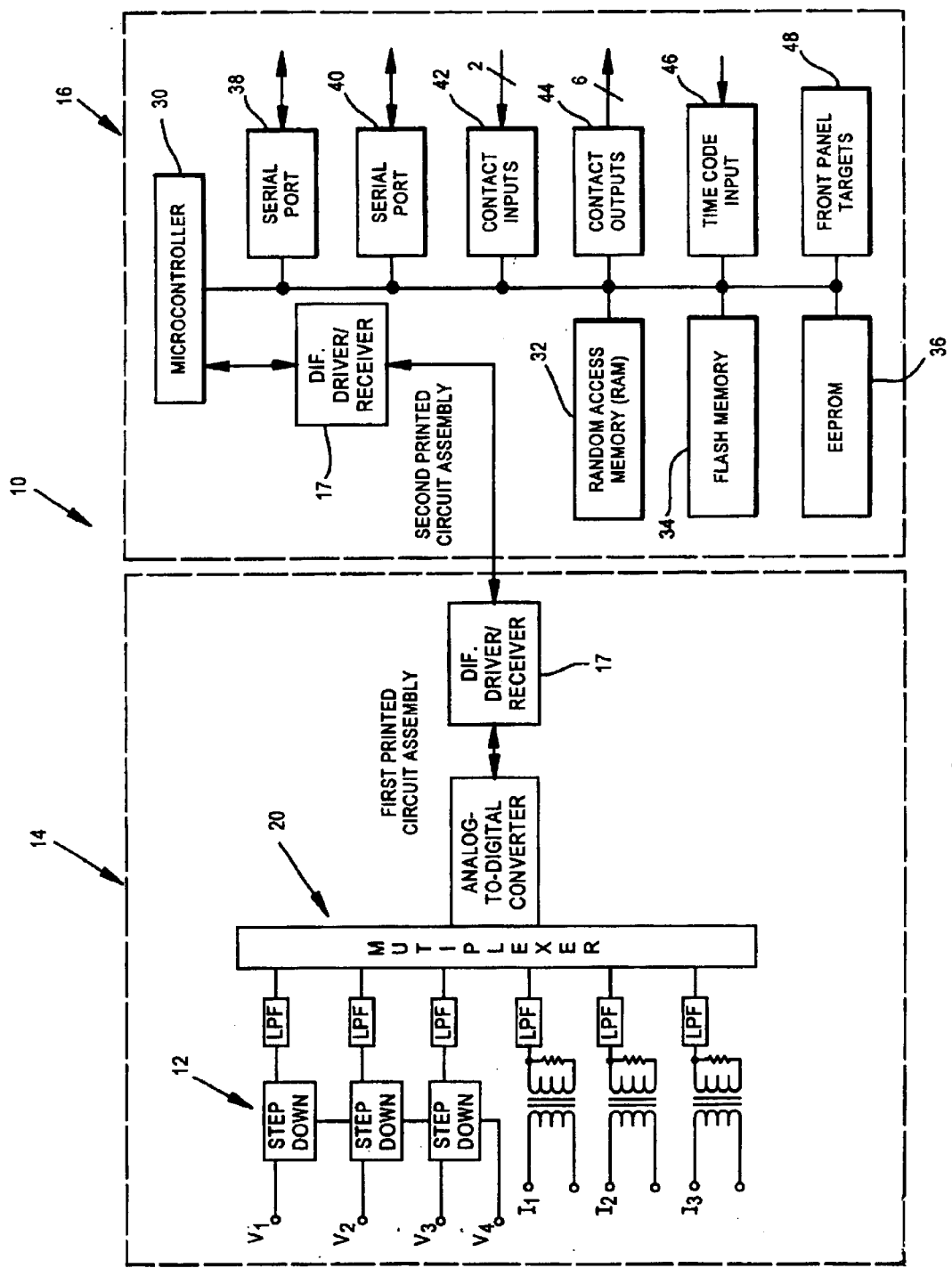
FIG. 1 is a block diagram of a microprocessor-based protective relay for power systems.

FIG. 1 shows a typical example of a microprocessor-based protective relay for a power system, generally at 10, for illustration of the present invention. In the embodiment shown, the microprocessor-based relay 10 comprises two printed circuit board assemblies 14 and 16. Other circuit board arrangements, however, can be used. The two circuit board arrangement, as shown, is particularly convenient for the embodiment of the present invention described herein. Three phases of voltage, $V_1$, $V_2$ and $V_3$, and three phases of current, $I_1$, $I_2$ and $I_3$, from the power line are applied, respectively, to step-down circuits or transformers, shown generally as a group at 12.

In addition to the three phase voltages $V_1$, $V_2$ and $V_3$, a system-neutral voltage, $V_4$, is connected to each of the voltage step-down circuits 12. The system-neutral voltage is usually zero. The outputs from the step-down circuits are low pass filtered, and then are sampled by an A/D converter 20 with a built-in multiplexer. The digital signals from the A/D converter are then applied to the microcontroller circuit board 16 via a differential interface, which uses differential driver/receiver circuits 17—17 to accommodate any common mode voltage that might develop on the signals through the interface due to ground potential differences between the two circuit boards 14 and 16.

The protection functions of the relay are carried out by the microcontroller in conventional fashion. The elements connected to the microcontroller board 16 include microcontroller 30, RAM memory 32, flash memory 34 and EEPROM memory 36. In addition, there are serial ports 38 and 40 for the relay as well as contact input and contact output connections 42 and 44. Time code input and front panel targets (lights) are also included, represented at 46 and 48.

Figure 2:
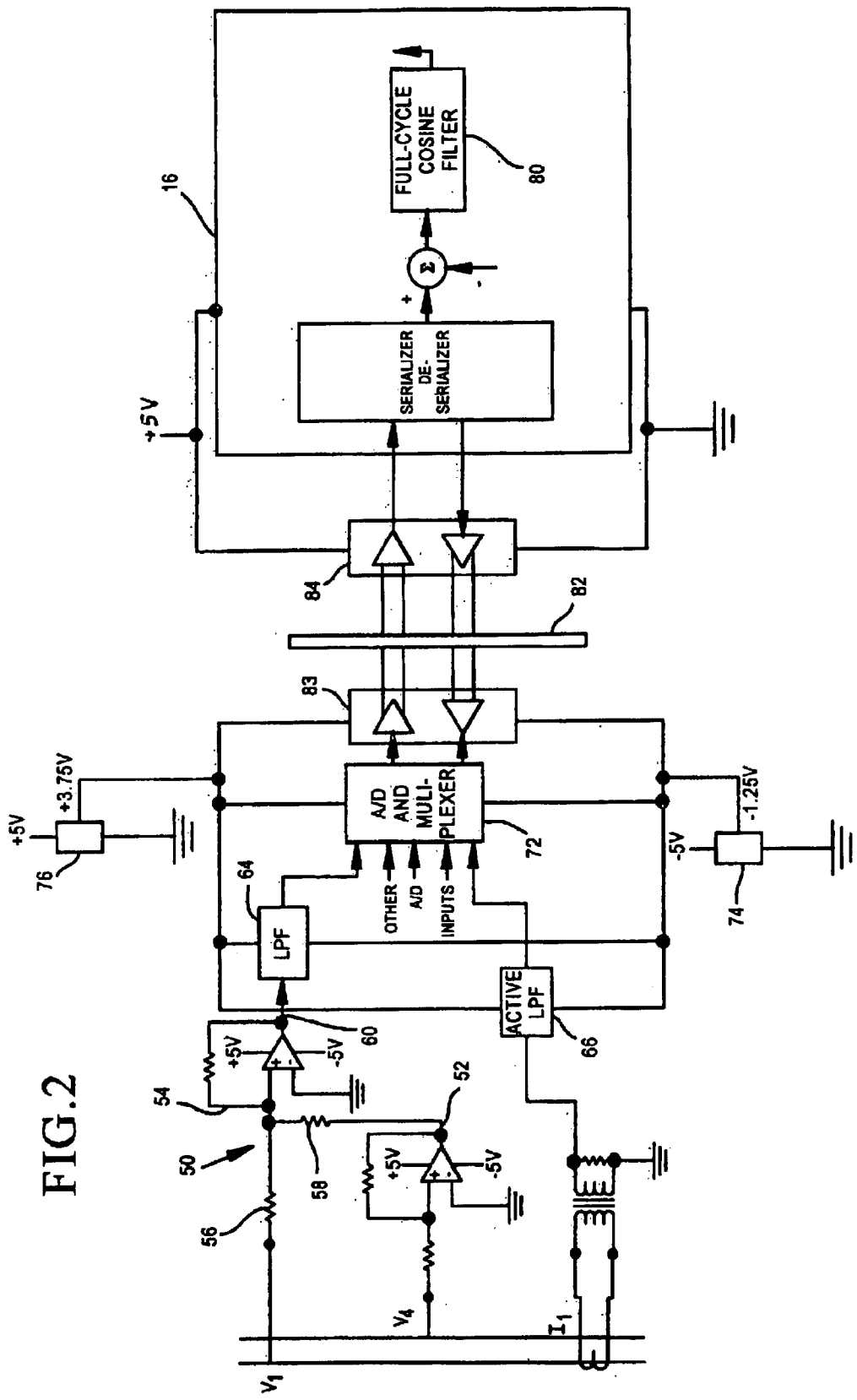
FIG. 2 is a block diagram showing the present invention in the context of the microprocessor relay of FIG. 1.

FIG. 2 shows the circuit of the present invention. It includes, for illustration, just one single phase voltage input $V_1$, the neutral voltage $V_4$ and one single phase current $I_1$. The voltages are stepped down by a resistance voltage divider/op-amp (operational amplifier) circuit 50, comprising first and second op-amps 52 and 54 and a voltage divider, comprising a resistance 56 and a connecting resistance 58, with connecting resistance 58 between the two op-amps being the value of resistance 56 divided by 500. The output of the voltage divider/op-amp circuit is on line 60 with value of:

$$\frac{V_4 - V_1}{500}$$

A typical resulting value might be $-0.7 V_{RMS}$, i.e. where $V_4-V_1$ is $-350$ volts. The sign of the resulting value is changed to positive in software. It should be understood, however, that other step-down arrangements could be used, including conventional step-down transformers.

An advantage to the voltage divider/op-amp step-down circuit shown is that it is smaller and less expensive than conventional iron core transformers. The arrangement shown has a significant capability of rejecting common mode voltage present in $V_1$ and $V_4$. With the particular arrangement and circuit values and voltages shown, common mode voltage up to a value of 500 times the power supply voltage to op-amp 52 can be rejected. In the embodiment shown, the op-amp power supply voltage is 5 volts, so a total of 2500 volts of common mode voltage can be rejected.

The outputs of the step-down voltage and current circuits are applied to low-pass filters 64 and 66, the outputs of which are applied to an A/D converter 72/multiplexer 74 combination, along with the other voltage ($V_2$, $V_3$) and current ($I_2$, $I_3$) inputs.

Conventionally, A/D converter 72 in such circuits is a bipolar device, i.e. it can measure both positive and negative voltages with respect to ground. The bipolar A/D converter typically has a ground reference, as do low-pass filters 64 and 66.

In the present invention, however, the A/D converter 72 is a unipolar device, i.e. it measures only positive voltages with respect to ground. Typically, input signals to a unipolar A/D converter are adjusted so that they are entirely above ground, to permit processing of the entire input signal. Otherwise some portion of the signal is cut off. This is In the present invention, however, the original input signals are used, with their original values, just as for a bipolar A/D converter, i.e. the input signals can have both positive and negative portions. The A/D converter 72 and the low-pass filter stages 64–64 have a power supply voltage that is offset from ground. The ground pin of the A/D converter and low pass filter is set at a selected negative potential. The negative potential must be at least as negative as the most negative signal applied to the input of the A/D converter or the low-pass filter. Typically, it is convenient to make the negative potential equal to one half of the positive input signal range of the A/D converter.

In such an arrangement, the A/D converter will produce a mid-scale output value when the input to the low-pass filter is at or very near ground. Hence, when the input to the low-pass filter goes to its most negative point, the output code of the A/D converter will be close to zero. In the particular embodiment shown, the ground pin reference for the A/D converter is set at is –1.25 of volts; however, this is only one example. Other values can be selected depending upon the anticipated input to the low-pass filter and the positive input range of the A/D converter. The A/D converter in the present embodiment has an internal 2.5-volt reference, and operates from a single +5 volt supply with respect to its ground pin. The actual reference point (–1.25V) is thus below ground potential by one-half the reference voltage of the A/D converter.

Since the A/D converter and the low-pass filter are intended to operate from a single +5V supply (the step-down converter circuits operate from +5V and –5V supplies), the A/D power supply pins will be at –1.25V ground pin reference (instead of 0) and 3.75V (instead of 5V). The –1.25V supply is provided by a –5V source and linear regulator 74, while the 3.75V supply is provided by a +5V reference and linear regulator 76. This arrangement has the advantage of the relay being able to use a less expensive unipolar A/D converter.

Any error or temperature coefficient on the –1.25V reference line will result in the output of the A/D converter 72 having an offset error; however, a full-cycle cosine digital filter 80 in the microcontroller portion of the relay removes this offset error. The unipolar A/D converter 72 with the negative reference voltage will respond to frequencies equally between DC and the end of its stated bandwidth, just like a bipolar device, and will not have any of the other disadvantages discussed above with respect to unipolar devices in such applications.

Since the unipolar A/D is powered by +3.75V and –1.25V supplies, the digital interface between the A/D converter board and the microcontroller board will not provide signals with conventional TTL levels expected by the microcontroller board circuits. However, these voltage differences can be accommodated by using a differential driver and receiver combination between the A/D converter board 4 and the microcontroller board 16. The digital waveforms can still be accurately produced. The differential driver and receiver circuits, respectively, located between the two boards 14 and 16 with an intermediate board interface connector 82, are shown at 83 and 84. The differential driver and receiver must have adequate common mode range to accommodate the offset introduced by the –1.25 volt power supply. An alternative embodiment to the differential driver/receiver arrangement is optical couplers between the A/D converter and microcontroller boards.

Accordingly, a sampling system has been described using a unipolar A/D converter for sampling bipolar input analog signals. By using a ground pin reference, which is at least as negative as the most negative expected part of the input signals, the unipolar A/D converter can process original bipolar analog input signal. There are relatively few disadvantages to such an arrangement and several advantages. The use of differential drivers or optical couplers from the A/D converters to a microcontroller will accommodate voltage variances between the boards relative to the normal input levels.

Although a preferred embodiment of the present invention has been described for purpose of illustration, it should be understood that the various changes, modifications and substitutions made in such an embodiment without departing from the spirit of the invention which is defined by the claims that follows:

What is claimed is:

1. A system for sampling a bipolar analog signal, the sampling system being used in a protective relay for an electric power system, comprising:
   a unipolar A/D converter for processing bipolar input analog signals in the form of voltage and current values to corresponding digital signals, wherein the A/D converter has a ground pin reference voltage which is at least as negative as the most negative portion of the input signals to be processed by the A/D converter, such that the entire input signal is processed by the A/D converter to produce a corresponding digital output.

2. A system of claim 1, including a low-pass filter connected prior to the A/D converter, wherein the low-pass filter has the same negative reference voltage as the A/D converter.

3. A system of claim 1, wherein the system includes means to compensate for voltage differences between the output signal levels of the A/D converter and expected threshold signal levels at the microcontroller caused by the A/D converter reference voltage.

4. A system of claim 1, wherein the ground pin reference voltage at the A/D converter is lower than ground potential by approximately one-half of the internal reference voltage of the A/D converter.

5. A system of claim 3, including a cosine filter responsive to the output of the A/D converter to remove any offset errors created in the A/D converter output by the negative reference voltage.

6. A system of claim 3, wherein the compensating means comprises differential driver and receiver circuits.

* * * * *